United States Patent
Petrone et al.

(10) Patent No.: US 12,322,568 B2
(45) Date of Patent: Jun. 3, 2025

(54) AUTO-FOCUS SENSOR IMPLEMENTATION FOR MULTI-COLUMN MICROSCOPES

(71) Applicant: KLA Corporation, Milpitas, CA (US)

(72) Inventors: Nicholas Petrone, San Jose, CA (US); Lawrence Muray, Moraga, CA (US); Alan Brodie, Palo Alto, CA (US)

(73) Assignee: KLA Corporation, Milpitas, CA (US)

( * ) Notice: Subject to any disclaimer, the term of this patent is extended or adjusted under 35 U.S.C. 154(b) by 471 days.

(21) Appl. No.: 17/930,332

(22) Filed: Sep. 7, 2022

(65) Prior Publication Data

US 2024/0079203 A1      Mar. 7, 2024

(51) Int. Cl.

| | |
|---|---|
| *H01J 37/21* | (2006.01) |
| *H01J 37/244* | (2006.01) |
| *H01J 37/28* | (2006.01) |
| H01J 37/20 | (2006.01) |

(52) U.S. Cl.
CPC ............ *H01J 37/21* (2013.01); *H01J 37/244* (2013.01); *H01J 37/28* (2013.01); H01J 37/20 (2013.01); H01J 2237/20235 (2013.01); H01J 2237/216 (2013.01); H01J 2237/24578 (2013.01)

(58) Field of Classification Search
CPC .. H01J 37/00; H01J 37/21; H01J 37/26; H01J 37/244; H01J 37/28; H01J 37/20; H01J 2237/20235; H01J 2237/216; H01J 2237/24578; H01J 2237/2482
USPC ................................ 250/306, 307, 310, 311
See application file for complete search history.

(56) References Cited

U.S. PATENT DOCUMENTS

| | | |
|---|---|---|
| 6,369,385 B1 | 4/2002 | Muray et al. |
| 8,836,358 B2 | 9/2014 | Baekbo et al. |
| 9,194,829 B2 | 11/2015 | Smith et al. |
| 10,312,052 B2 | 6/2019 | Kruit |
| 10,313,622 B2 | 6/2019 | Chuang et al. |
| 10,545,099 B1 | 1/2020 | Chen et al. |
| 10,778,925 B2 | 9/2020 | Chuang et al. |

(Continued)

FOREIGN PATENT DOCUMENTS

| | | |
|---|---|---|
| CN | 106324820 A | 1/2017 |
| EP | 2329322 B1 | 9/2016 |

(Continued)

OTHER PUBLICATIONS

Written Opinion and International Search Report for PCT/US2023/031799, dated Dec. 22, 2023, 7 pgs.

*Primary Examiner* — Jason L McCormack
(74) *Attorney, Agent, or Firm* — Kwan & Olynick LLP

(57) ABSTRACT

An array of localized auto-focus sensors provides direct measurement of the working distance between each microscope column in the array and the substrate being imaged below. The auto-focus sensors measure the working distance between each column and the imaging substrate as it passes over a point on the substrate to be imaged. The working distance measurement from the sensors is input into a control system, which in turn outputs the required working distance adjustment to the microscope column. The control system independently adjusts microscope working distance and/or physical distance of an individual microscope column in a multi-column microscope based on auto-focus sensor input. The individual microscope columns in the multi-column microscope can also be used as the auto-focus sensor itself.

20 Claims, 6 Drawing Sheets

(56) References Cited

U.S. PATENT DOCUMENTS

| | | | |
|---|---|---|---|
| 2002/0033449 A1* | 3/2002 | Nakasuji | H01J 37/05 |
| | | | 250/306 |
| 2005/0230633 A1* | 10/2005 | Lo | B82Y 40/00 |
| | | | 250/396 ML |
| 2006/0060781 A1* | 3/2006 | Watanabe | B82Y 40/00 |
| | | | 250/310 |
| 2007/0095805 A1 | 5/2007 | Knowles | |
| 2008/0266652 A1 | 10/2008 | Yazdanfar et al. | |
| 2018/0286724 A1* | 10/2018 | Xu | H01J 37/28 |

FOREIGN PATENT DOCUMENTS

| | | |
|---|---|---|
| JP | H10223525 A | 8/1998 |
| WO | 2009032681 A1 | 3/2009 |
| WO | 2020097137 A1 | 5/2020 |
| WO | 2022008286 A1 | 1/2022 |

* cited by examiner

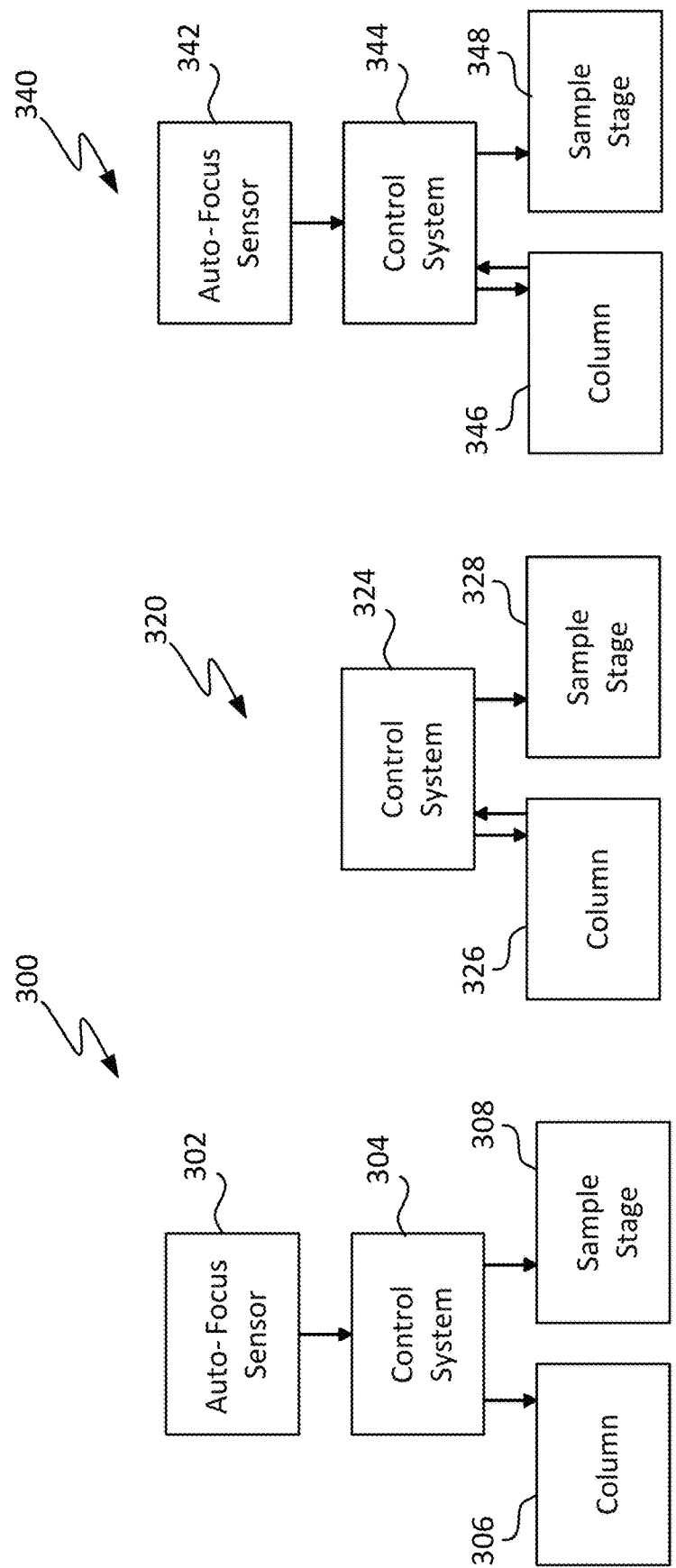

AUTO-FOCUS SENSOR IMPLEMENTATION FOR MULTI-COLUMN MICROSCOPES

TECHNICAL FIELD

The disclosure generally relates to the field of wafer inspection systems. More particularly the present disclosure relates to multi-column electron beam inspection systems.

BACKGROUND

Generally, the industry of semiconductor manufacturing involves highly complex techniques for fabricating integrated circuits using semiconductor materials which are layered and patterned onto a substrate, such as silicon. Due to the large scale of circuit integration and the decreasing size of semiconductor devices, the fabricated devices have become increasingly sensitive to defects. That is, defects which cause faults in the device are becoming increasingly smaller. The device needs to be generally fault free prior to shipment to the end users or customers.

The semiconductor industry requires high resolution microscopes for defect inspection of patterned wafers and mask reticles. In order to increase scan speed and inspection throughput, multiple microscope columns can be arrayed for parallel imaging of a desired substrate.

While progress is being made toward the development of multi-column microscopes and their integration into functional inspection tools, specifically for scanning electron microscopes (SEMs), a major outstanding challenge is maintaining each column in proper focus on a common inspection surface.

In order to achieve functional multi-column inspection tools, an auto-focus system is required that provides localized working distance measurement between each column and the imaging substrate at the point of inspection. SEMs have a further challenge that substrate charging during imaging may cause a discrepancy between effective focal length and physical working distance. An ideal auto-focus system for use in multi-column SEMs will be able to correct for substrate charging. Thus, there is a need for a system and method for implementing auto-focus sensors for use in multi-column microscopes that is suitable to maintain each active microscope column in focus.

SUMMARY

The following presents a simplified summary of the disclosure in order to provide a basic understanding of certain embodiments of the disclosure. This summary is not an extensive overview of the disclosure and it does not identify key/critical elements of the disclosure or delineate the scope of the disclosure. Its sole purpose is to present some concepts disclosed herein in a simplified form as a prelude to the more detailed description that is presented later.

Aspects of the present disclosure relate to a system and device. The system and device comprise a multi-column array of scanning electron microscopes (SEMs). The system and device also include an array of autofocus sensors in line with the multi-column array of scanning electron microscopes. The system and device also include a controller. Last, the system and device also include a stage configured to hold an imaging sample and to swath in multiple directions.

In some embodiments, the array of auto-focus sensors is configured to allow for simultaneous measurement of working distance or position between multiple microscope columns and imaging substrates. In some embodiments, the controller is configured to implement a feedback control loop that inputs autofocus sensor signals and outputs signals to adjust either column focal distances or column-to-sample working distances required to allow each active imaging column in multi-column microscope to maintain proper focus on the imaging sample. In some embodiments, the controller is configured to allow each autofocus sensor in the array of autofocus sensors to independently measure column-to-sample working distances. In some embodiments, the controller is configured to allow each autofocus sensor in the array of autofocus sensors to measure column-to-sample working distances in parallel with other autofocus sensors. In some embodiments, the controller is configured to allow each column in the multi-column array of SEMs to independently adjust column-to-sample working distances. In some embodiments, the controller is configured to allow each column in the multi-column array of SEMs to adjust column-to-sample working distances in parallel with other columns in the multi-column array of SEMs. In some embodiments, the controller is configured to allow each column in the multi-column array of SEMs to act as an autofocus sensor to measure effective working distances to the imaging sample in between image scans. In some embodiments, a column of autofocus sensors sits in between two columns of SEMs. In some embodiments, the controller is configured to move the stage in multiple degrees of freedom.

These and other aspects of the disclosure are described further below with reference to the figures.

BRIEF DESCRIPTION OF THE DRAWINGS

FIG. 3A illustrates the basic operation of a control systems diagram, in accordance with embodiments of the present disclosure.

FIG. 3B illustrates an alternate control systems arrangement, in accordance with embodiments of the present disclosure.

FIG. 3C illustrates a control systems arrangement using a combination auto-focus strategy, in accordance with embodiments of the present disclosure.

DETAILED DESCRIPTION OF EXAMPLE EMBODIMENTS

Figure 1:
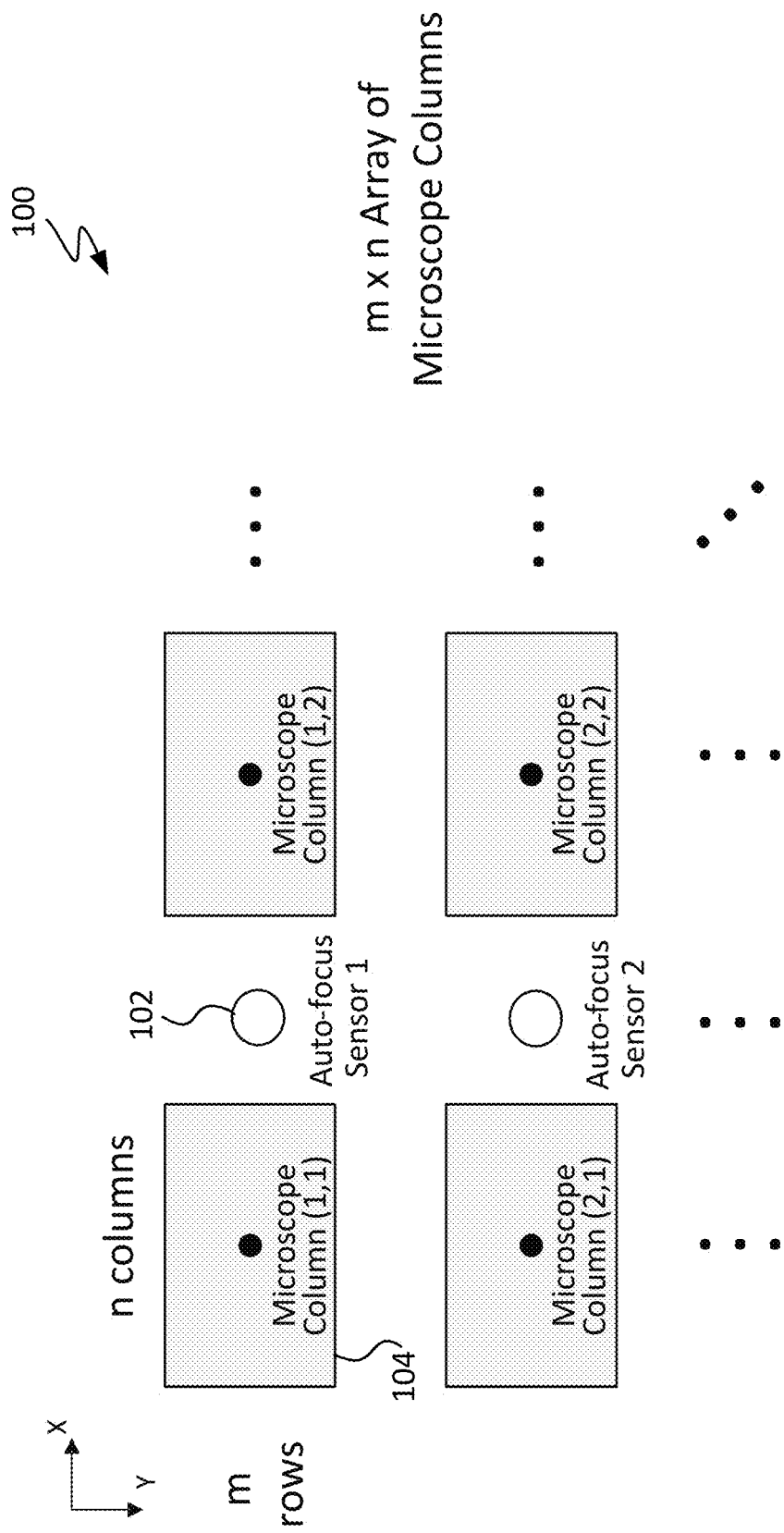
FIG. 1 is a schematic drawing showing a top-down view of an m×n array of microscope columns in a multi-column microscope, in accordance with embodiments of the present disclosure.

In the following description, numerous specific details are set forth in order to provide a thorough understanding of the present disclosure. The present disclosure may be practiced without some or all of these specific details. In other instances, well known process operations have not been described in detail to not unnecessarily obscure the present disclosure. While the disclosure will be described in conjunction with the specific embodiments, it will be understood that it is not intended to limit the disclosure to the embodiments.

In a single microscope column system, there is typically a single column looking down at a wafer or reticle. There needs to be a way to bring the inspection sample into the focal plane of the microscope plane. In a single column system, the wafer can be perfectly perpendicular because the stage can be moved and only a single focal point needs to be brought into focus on a 2D plane. However, with a multi-column system, e.g., 10 columns in a 5×2 array, the focusing problem becomes more complex. This is because with 10 focal points, the mechanical tolerances for those focal points will never be in the same plane. Even if a system has tip and tilt control, as well as z-axis control on the stage, if the wafer is perfectly flat, there is no way currently to get 10 points totally in focus in the same plane. Plus, if the wafer is going to be bowed itself, the wafer is never flat, which provides an extra challenge for getting 10 microscope columns into focus on the stage.

Auto-focus sensors currently used in inspection microscopes rely on non-contact methods to measure distance or displacement between the sensor and substrate in order to prevent physical damage to the sample being imaged, typically a patterned wafer or reticle. Furthermore, current inspection microscopes rely on remote mounting of auto-focus sensors. There are two typical configurations for remote auto-focus sensors.

The first configuration for remote auto-focus sensors implements a single distance or displacement sensor. To avoid physical interference with the microscope columns, the sensor must be placed remotely. Laser-based optical sensors are typically used, as it allows for remote mounting with a long measurement range. A common auto-focus sensor projects a laser beam at a low incident angle onto the imaging surface. The point where the laser beam hits the imaging surfaces sets the measurement position of the sensor. The laser beam is reflected off of the imaging surface and onto a position sensitive diode (PSD). As the imaging surface is translated on a linear stage during the course of inspection, changes in height on the imaging surface result in a change in laser reflection angle and are detected as shifts in laser position on the PSD.

This technique is the operating principal behind autofocus in single-column electron microscopes. Because the sensor's measurement target can be directed at or near the electron microscope's imaging area, only a single point of measurement is required; the microscope's focal point or working distance is adjusted to bring the sample in focus at a single measurement point.

The second configuration relies on multiple position or displacement sensors located remotely from the imaging position of the column. The sensors measure distance to at least three points on the imaging surface or chuck. Sensor positions can be arbitrarily far away from the microscope's point of imaging. Provided that the relative X and Y distances are known between the multiple sensor heads, the sensor's measurement height in Z can be used to calculate an imaging plane. Microscope focus can be achieved by bringing the focal point of the microscope onto the calculated imaging plane.

Because these sensors are located remotely from the imaging column, physical interference between a single imaging column and the sensor head is less likely. Sensors can be placed directly above measurement targets for easier integration. And the targeted measurement area on the substrate can be larger than the microscope's imaging spot area without loss of focusing accuracy. In this case, electronic sensors such as capacitive or eddy current sensors are typically implemented.

Capacitive sensors apply an electric between the sensor head and target substrate. The sensor measures capacitance as a function of distance between the sensor head and target.

Eddy current sensors generate an alternating current in a wire coil located in the sensor. This current generates an AC magnetic field, which induces smaller AC currents (eddy currents) with in the target. The eddy currents in turn generate an opposing magnetic field. The induced magnetic field is proportional to the distance between the sensor head and target.

Previous microscope auto-focus methods have been design for use in single-column microscopes. However, they do not provide an appropriate solution for multi-column microscopes. Because the multi-column microscopes, in particular multi-column SEMs, are still in the nascent phase of development, previously designed auto-focus sensors have not been designed for functionality with multi-column microscopes.

Typical autofocus sensors utilize a laser that shines on the surface of the wafer at a low angle and it bounces off the surface of the wafer. The wafer reticle acts like a mirror. The angle of incidence is the angle of refraction, so the laser bounces off at the same angle as the incoming angle. The laser then hits a position sensitive diode, which correlates the position of the beam to spatial coordinates (x, y). As the wafer goes upward, the laser hits a different point on the wafer and the reflective path changes. The changing path corresponds to a shift of the position on the position sensitive diode. However, one challenge is that the laser requires a really long optical path.

These typical autofocus sensors are designed for single column e-beam inspection tools. One advantage of these type of sensors is that because it is a laser path, the laser source and sensor can be mounted remotely, outside the vacuum chamber. However, as mentioned above, the long light path requires a large amount of space, which is fine for single columns but impractical for multi-column systems due to interference.

Another typical sensor is a capacitive sensor. A capacitive sensor is an electrode that is placed above the target being measured, e.g., the wafer. The electrode applies a voltage and generates a capacitance across the wafer on the sensor head. The air gap acts as the insulator and, as the distance changes, the capacitance changes. However, the challenge for capacitive sensors is that the capacitor and the wafer need to be on the same bias for the sensor to work. For optical tools, capacitive sensors work well because the bias can be ground potential. But in scanning electron microscopes, the bias on the wafer may climb up to 5000 volts, which is too high for the design of capacitive sensors.

Another option is to use an interferometer. An interferometer is another laser measurement system. The light source can be mounted remotely from the system. The interferometer shines straight down on the sample and the reflective path shines straight up to the sensor. However, interferometers can be quite large. In addition, interferometers are relative distance measurement systems, not an absolute measurement system. In other words, interferometers gives relative changes, which works well until there is a missing data point. If a data point is missing for whatever reason, the system loses track of what that zero point is. On pattern wafers or reticles, the wafers have pattern features on the order of ten to hundreds nanometers, which is the same scale as the wavelength of light in the lasers, which can lead to interference. As the system scans a wafer, or reticle, oftentimes with optical position sensors, a missing data point occurs when the pattern wafer interferes with the sensor. If a data point is missed, then measurements are thrown out because there is no baseline. Thus, absolute measurement sensors are ideal for column devices.

Disadvantages of previous autofocus methods depend on the exact sensor configuration implement. Specific disadvantages of each configuration are detailed as below.

Single, remote mounted sensors, require a long optical light path that is not physically compatible with arrays of microscope columns. For single microscope columns, the long optical path is advantageous to simultaneously allow for a distance measurement at or near the point of inspection, while simultaneously preventing physical interference between the light source/sensor unit and the microscope column. Single microscope columns with fairly large working distances (mm to cm rage) typically do not have physical interference with the sensor's optical light path. However, integrating such sensors into multi-column arrays becomes challenging to impossible. For multi-column microscopes with columns arranged in multiple array columns and rows, the light path will be disrupted by columns.

The optical path for the sensor may be compatible with multi-column microscopes with a long working distance, provided that they are arranged in a single column array. However, in order to achieve multi-column microscopes, dimensions of the columns must be reduced to allow a meaningful number of inspection columns to fit in parallel over the same imaging substrate. For the SEMs, columns with dimensions suitable for multi-column microscope arrays typically have working distances around 1 mm. The short working distance makes it impossible to integrate a laser based optical sensor without the column interfering with the sensor's light path.

A secondary concern would be measurement reliability of optical sensors. Patterned wafers or reticles typically have topography and/or changes in material composition on length scales tens to hundreds of nanometers. This is a similar length scale to the wavelength of the sensor's incident laser (typically on the order of 200-1000 nm). Interference between the incident laser light and the substrate pattern can cause loss of signal on the PSD. Furthermore, non-planarity in the substrate, such as wafer bow, can cause larger shifts in reflection angle than would be caused by topography changes alone. The sensor's reliance on an angled reflection can cause erroneous sensor measurements.

Multiple remote mounted sensors are also problematic. The multiple remote sensors configuration cannot allow for proper focus of multiple microscope columns, especially on a non-planar substrate (such as a bowed wafer). Rather than directly measure distance to points being imaged, remote sensor arrays measure distance to points on an imaging surface and use this information to calculate a theoretical and flat image plane. For a microscope with a single column, this system is sufficient. The column's focal point can be approximated as a single point in space. By adjusting working distance of the microscope's column or the physical distance between the column and imaging plane, the microscope's single focal point can be brought onto the plane of the object to be imaged. However, this focus system unfortunately does not work for a multi-column microscope array. Each microscope column has an individual focal point. Due to differences in mechanical tolerances between column fabrication and mounting, the column focal points will be spaced in X, Y, as well as Z. For an array with more than 3 columns, focal points will not all lie in the same plane. If the imaging sample is mounted on a stage even with 6 degrees of freedom, the stage can adjust in height, tip, tilt, and/or yaw to bring the sample plane to match the focal points of at most 3 columns. Furthermore, imaging substrates will not be perfectly planar. Patterned wafers can have bow causing hundreds of microns of bow in height between the center and edge. No amount of sample stage adjustment in height, tip, tilt, and/or yaw adjustment can correct for non-planarity in the measurement substrate. A global auto-focus measurement to approximate the imaging surface as a wafer plane simply cannot be used to bring multiple columns into focus.

All current auto-focus sensors have an additional limitation for microscopes based on columnated charged particles, including, but not limited to, scanning electron microscopes (SEMs). Imaging in an SEM can result in sample charging due to exposure of the sample to incident high energy electrons from the probe beam. Charge accumulation on the surface of the sample can interact with the incoming SEM beam and result in an effective working distance for the column that differs from the physical working distance. In this case, no previously implemented autofocus methodology can account for discrepancies between effective and physical working distances in SEMs.

It may be worth noting that in multi-beam systems, beams are condensed to a small xy area directly underneath a microscope column. Thus, the field of view of a multi-beam system is on the order of 250 um, which is small enough to use an approximation of the focal point using just a single autofocus sensor. This multi-beam approximation technique would not work for a multi-column system however because individual columns in a multi-beam system can have distances on the order of 300 mm between columns.

The techniques and mechanisms of the present disclosure provide for an auto-focus system that is functional for a multi-column microscope. The system consists of an array of local position or distance sensors. The sensors are positioned in-line with the microscope columns, in a configuration that allows a point on a sample, which is moved relative to an imaging column, to pass under or near both a position sensor and imaging column. The auto-focus sensors are arranged such that each sensor scans at or near the positions to be imaged with the sensor's corresponding microscope column. Multiple microscope columns may share the same sensor, provided that the sensor measures at or near the position on the wafer to be imaged by any given microscope column in a multi-column microscope. FIG. 1 is a schematic drawing showing a top-down view of an m×n array of microscope columns in a multi-column microscope, in accordance with embodiments of the present disclosure. Microscope array 100 shows the microscope columns 104 arranged in a regular array of m array columns and n array rows. Each of the n array rows would have at least one corresponding auto-focus sensor 102, located either between the m microscope columns 104 or outside of microscope array 100.

According to various embodiments, position sensors can be any absolute position or relative distance sensor that can provide a measurement to the sample being measured. In one ideal configuration, position sensors are non-contact measurement sensors, to avoid damage to delicate substrates being imaged. In some embodiments, the sensor should have sufficient measurement resolution and measurement target area to allow imaging sample (such as a patterned wafer) to stay within the working distance of the microscope column. In some embodiments, measurement resolution of the sensor should be equal to or less than the depth of focus on the microscope column. Examples of suitable position or distance sensors include, but are not limited to, the following sensors: optical interferometers, optical confocal sensors, capacitive sensors, and/or eddy current sensors. In some embodiments, suitable sensors could be an array of a single type of position sensors, or a mixture of multiple sensor types. According to various embodiments, an array of very compact autofocus sensors are embedded inside of a microscope array. In such embodiments, as the stage scans in swaths, each autofocus sensor measures a point on the wafer that will fall under a microscope column in the inspection area. This is because it is not possible to place the sensors directly under the point at which the wafer scans. Therefore, the autofocus sensors are placed directly next to microscope columns in order to measure the distance precisely to the point being inspected and then by the time it takes for an autofocused point to fall directly under a microscope point (called the "delay time"), the system can adjust the focal point of the microscope with the delay time. In some embodiments, the idea is to embed the autofocus sensor in each row of the column, as well as at least one autofocus sensor in each column row. In other words, if the system is scanning in the y direction, the system will need at least one autofocus sensor in between columns spaced in the y direction. Thus, each scan direction should have an Autofocus sensor. In some embodiments, more than one autofocus sensor can be embedded in between the columns, as long as the autofocus sensors are embedded into the multi-column array itself.

Figure 2A:
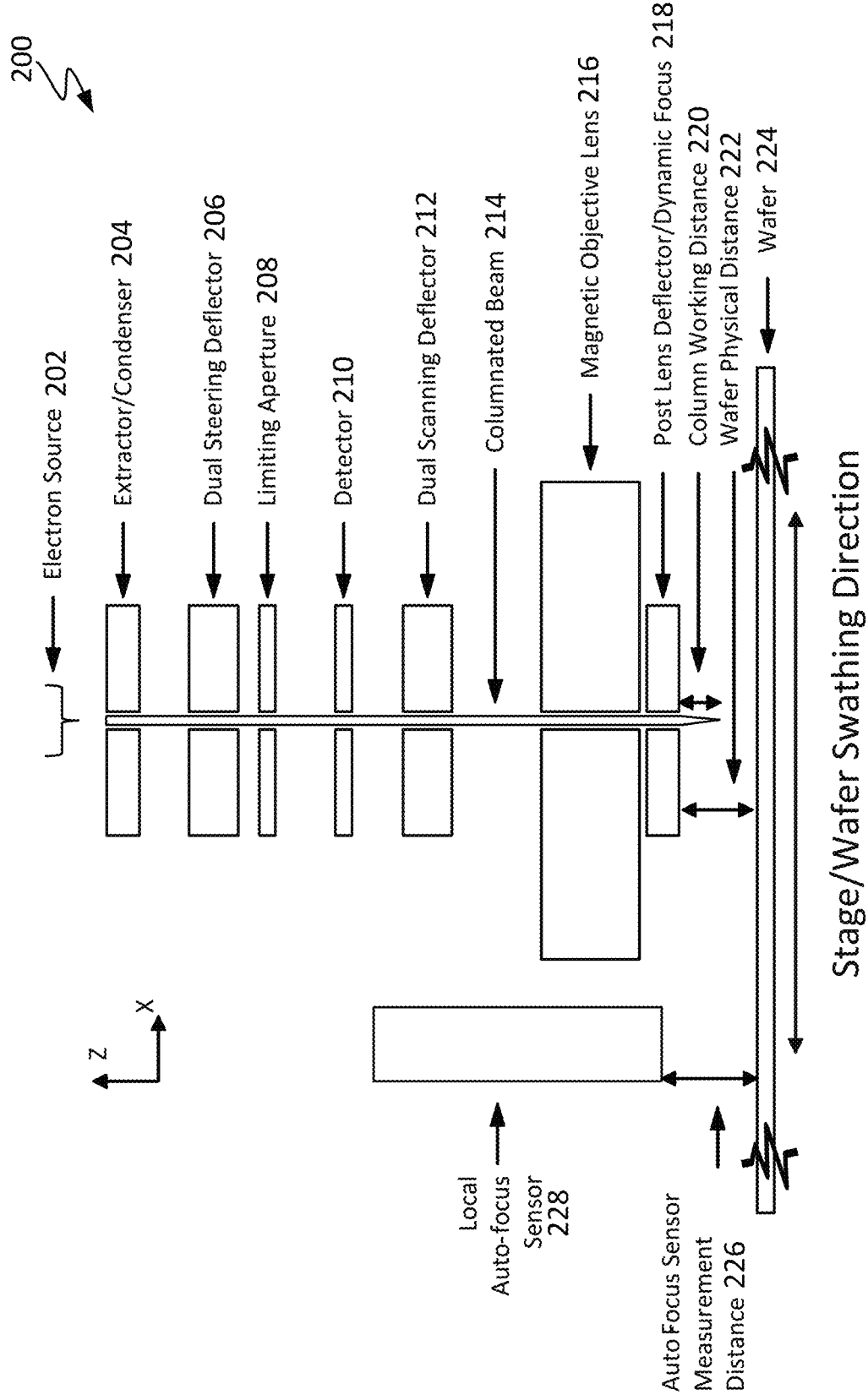
FIG. 2A illustrates a schematic showing side view of an individual SEM column in a multi-column microscope that is out of focus, in accordance with embodiments of the present disclosure.
Figure 2B:
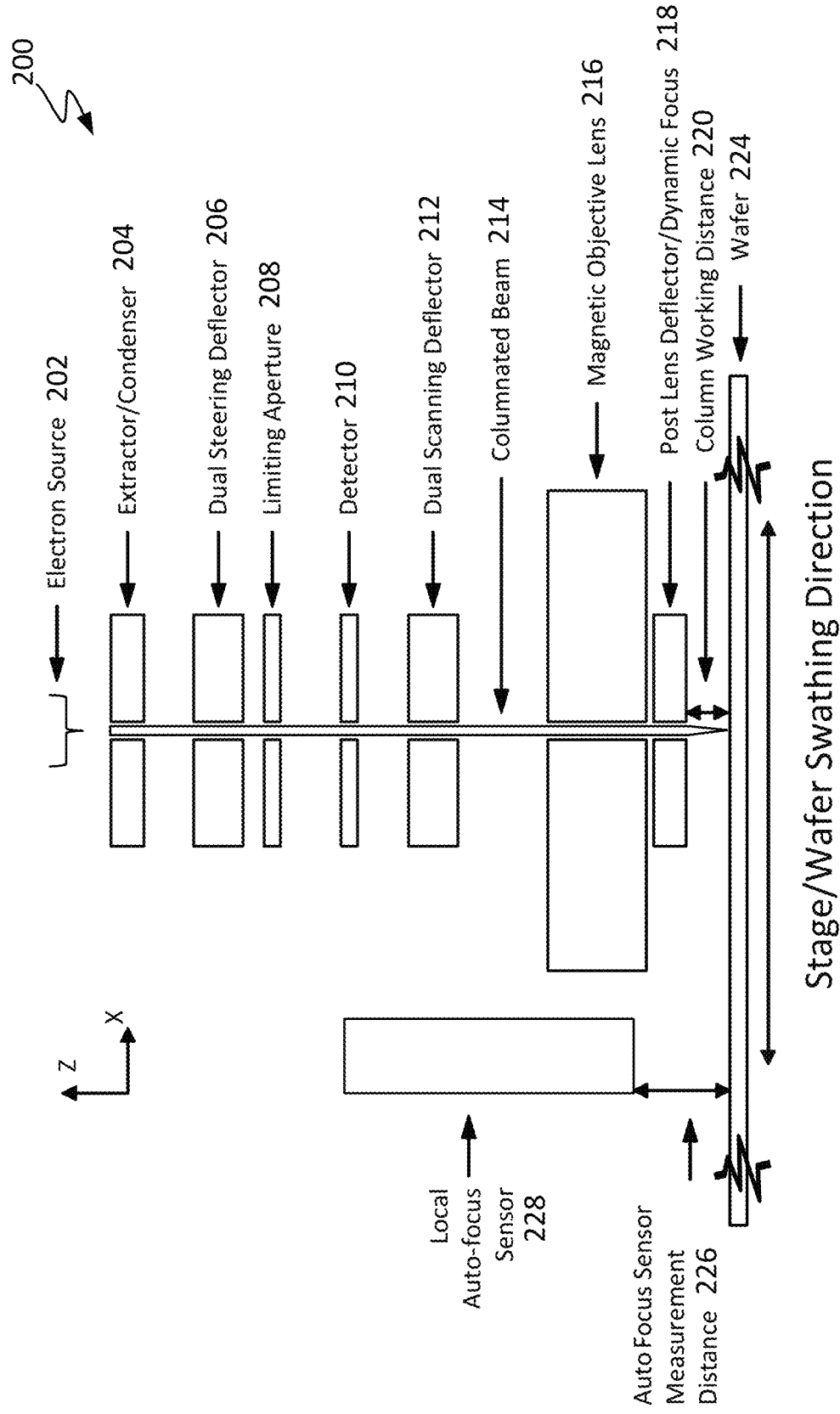
FIG. 2B illustrates a schematic showing side view of an individual SEM column in a multi-column microscope that is in focus, in accordance with embodiments of the present disclosure.

Both FIG. 2A and FIG. 2B illustrate a schematic showing side views of an individual SEM column in a multi-column microscope, in accordance with embodiments of the present disclosure. FIG. 2A shows a situation where the wafer is out of focus, e.g., the wafer physical distance is below the column working distance. FIG. 2B shows a situation where the wafer is in focus, e.g., the wafer surface sits at the column working distance.

As shown in FIGS. 2A-2B, column 200 includes an electron source 202 configured to emit an electron beam 214. In some embodiments, electron source 202 is a tungsten hairpin, or a tungsten hairpin with a fine wire, and it serves as the source of electrons. In some embodiments, electron source 202 can be a thermal emitter, a cold field emitter, a pure thermal, or anything that emits electrons.

According to various embodiments, column 200 also includes an extractor/condenser 204. In some embodiments, extractor/condenser 204 includes 2 components in that one block depicted in FIGS. 2A and 2B. In the particular example shown in FIG. 2A, the upper component is first and then the lower component is second. In some embodiments, extractor 204 applies an electric field to pull out electrons from electron source 202. The electrons then pass through an aperture in extractor 204 into condenser 204. In some embodiments, the extractor aperture is on the order of a hundred of microns wide. In some embodiments, condenser 204 is another electrostatic component comprising another aperture, but with a potential applied across the aperture, which straightens out the electrons that pass through. In other words, in some embodiments, electrons come out of electron source 202 at an angle, but straighten out as they pass through condenser 204.

According to various embodiments, column 200 also includes dual steering deflector 206. In some embodiments, dual steering deflector 206 includes two octopole deflectors, one on top of each other, configured to steer the beam such that the beam hits limiting aperture 208, which is the next component. In some embodiments, dual steering deflector 208 can be octopoles, dodecopoles, or any kind of poles so long as the poles are capable of steering an electron beam through limiting aperture 208.

In some embodiments, limiting aperture 208 is yet another element that defines electron beam 214. In some embodiments, limiting aperture 208 is also called the "beam defining" aperture. In some embodiments, the resolution of the system is determined by limiting aperture 208. In some embodiments, limiting aperture 208 is not biased, meaning it is normally at ground potential, and serves as the anode for the entire top part of column 200. In other words, the top components serve to extract, condense, steer electron beam 214 through limiting aperture 208. Typically, limiting aperture 208 is much smaller than any other element in column 200. In some embodiments, limiting aperture 208 is on the order of 1 to 100 microns wide. According to various embodiments, limiting aperture 208 ultimately defines the resolution and beam current in the system, so it is a very critical component.

According to various embodiments, column 200 also includes a detector 210. In some embodiments, detector 210 is configured to point downwards toward the sample. That way, electrons coming from electron source 202 passes through an aperture in detector 210 and travels down the column until they hit sample 224. After the electrons hit sample 224, secondary and backscatter electrons are reflected up and hit the active side of detector 210, which is facing downwards.

In some embodiments, column 200 also includes a dual scanning deflector 212. In some embodiments, dual scanning deflector 212 is similar to dual steering deflector 206, except that the function of dual scanning deflector 212 is to steer beam 214 over the field of view. In some embodiments, the field of view is an area where electron beam 214 is raster scanned. In some embodiments, the field of view can be anywhere from 10 microns to 1 mm. Thus, the field of view can be altered by adjusting dual scanning deflector 212.

In some embodiments, dual steering deflector 206 steers beam 214, which could be a pencil beam of electrons (a columnated beam), coming down through the column. Then deflector 212 will deflect beam 214 and move it onto the wafer over one edge or the other. When the electrons come back, they spread out in a manner insensitive to which part of the wafer beam 214 is hitting. In some embodiments, the system is designed such that the optics flood fill detector 210, regardless of where that pencil beam point hits on the wafer.

In some embodiments, beam 214 goes through magnetic objective lens 216. In some embodiments, the job of magnetic objective lens 216 is to focus the beam. In some embodiments, objective lens 216 is a static magnetostatic lens. In such embodiments, lens 216 only has one focal length, which can be a fixed length, e.g., 2 to 3 mm. Although a magnetostatic lens only focuses at one point, the lens is high quality with low aberrations. In such embodiments, this element is key to getting ultra high resolution.

However, in some embodiments, the distance between the focal point and the wafer varies. Since a magnetostatic lens has only one focal point, and additional component is needed. Thus, in some embodiments, column 200 includes post lens deflector/dynamic focus 218. The job of post lens deflector/dynamic focus 218 is to make up for whatever magnetic lens 216 cannot focus on. In other words, post lens deflector/dynamic focus 218 works together with magnetic objective lens 216 to focus the beam onto the wafer. However, in order to focus beam 214 onto wafer 224, the system must know where the surface of the wafer is. According to various embodiments, local auto-focus sensor 228 functions to determine where the surface of the wafer is.

If the upper dual deflector bends the beam too far off the axis of the magnetic lens, a kink is introduced in the beam, which can in turn introduce aberrations, stigmation, and chromatic aberrations. Thus, the system should not drive upper dual steering deflector too hard. However, in order to still maintain a big field of view, the system needs an additional kick to the beam, which is provided by post lens deflector 218. In addition, the dynamic focus aspect 218 provides a completely separate function. In some embodiments, dynamic focus 218 takes the point where beam 214 is in focus and moves the point up and down. In some embodiments, the dynamic focus element comprises an electrode that has a voltage applied to it. By changing the voltage, the system can move the focal point up and down.

In some embodiments, the system utilizes a confocal optical absolute position sensor. The confocal sensor takes white light, focuses the white light, and defracts the white light separate into spectrums. The confocal sensor focuses the various spectrums at different distances from the lens. Whichever wavelength of light is predominately reflected back determines the distance of the wafer.

There certain difficulties with integrating autofocus sensors in scanning electron microscopes. One difficulty is that scanning electron microscopes operate inside of a vacuum chamber. Thus, a locally integrated sensor in an array, needs to be mounted locally close to the columns within the array. Therefore, the system requires a sensor that is compact in size and fits in the array. Because the scanning electron microscope operates in a vacuum, the locally mounted sensor must be vacuum compatible. That means the typical materials used to assemble electronic sensor packaging, tend to outgas in vacuum systems. For example, a lot of polymers have chemical binders, which include a range of small chains. Solvents are used to cause the small chains to crosslink thereby forming the polymers. Some of these solvents and small polymers continually outgas when placed in a vacuum system, which ruins the vacuum environment.

In some embodiments, all the electronics in the light source on the sensor are external to the system. In some embodiments, the light is brought in and out of the system with a fiber optics cable, which is fed through the vacuum chamber. The fiber optics cable then brings the light source in, take it to the sensor head. In some embodiments, the sensor head comprises glass optics and some mirrors that reflect the light. The light is then focused onto the surface, and then bounces off. The reflected signal is carried out through the fiber optics cable to the electronics that are outside. In some embodiments, the fiber optic cable comprises a glass filament. If the sensor is not mounted locally, then the other option is to have the autofocus sensor be outside the vacuum chamber, with some viewports that look into the chamber. However, confocal sensors have a really short working distance, on the order of 10 s of mm or so, in which case the sensor needs to be mounted within that column array. In some embodiments, a glass viewport is hermetically sealed, which allows a sensor outside of the chamber to shine the light directly downward and back out.

Another difficulty is that the AF measurement distance is different from the column physical distance and the column working distance.

In some embodiments, the system measures a distance d. In an ideal case, the sensor head would line up exactly with the end of the column so the measured distance d would be the working distance. However, this might not happen so the working d of the sensor might be calibrated such that it is different from the working distance of the column. Thus, it is not necessary for the autofocus sensor to be mounted at the same height of the column. In some embodiments, the system measures a distance d with the autofocus sensor, which most likely is not the same as the working distance. In some embodiments, calibration includes taking the column and moving the wafer until it is as close as it could be to the working distance, and then moving the wafer up or down until the image comes in focus. In other embodiments, the dynamic focus on the column is adjusted until the image comes into focus. Then the autofocus sensor would measure a distance d. Since the system knows the column is in focus with the wafer, then d equals focus sensor distance plus offset. The offset is then subtracted from measurements.

In some embodiments, the displacement or distance measurement from the sensor can be used to calculate the physical distance between the column and substrate. Even if the auto-focus sensor is not perfectly aligned in the Z-axis, an offset can be used to determine the physical distance between the microscope column and substrate. The measured physical distance (Z) for a given measurement position on the substrate (X, Y) is input in a control system. When the measurement point in (X,Y) passes underneath the microscope column to be inspected, the control system outputs an adjustment to bring the sample to within the column working distance (as shown in FIG. 2B).

In order to control the autofocus sensor and e-beam column, a control system is needed. FIGS. 3A-3C illustrate three different examples of control systems that can be used to manage the autofocus sensors in an e-beam column. With autofocus sensors and small columns, it can be challenging to measure the distance at exactly the point of measurement, or the point of inspection. With a standing wafer, the goal is to make sure the system measures the distance to a point of inspection on the wafer when the inspection point is directly underneath the autofocus sensor. Then, as the stage moves the inspection point under the inspection column, the system needs to store that height in a control system, which tells the microscope at a later time to update the focus when the inspection point moves under the microscope.

As previously mentioned, FIGS. 3A-3C illustrate three different examples of control systems. FIG. 3A illustrates a basic operation control system, FIG. 3B illustrates a control system that utilizes the column as an autofocus sensor, and FIG. 3C illustrates a control system that utilizes a combination of a dedicated sensor and the column.

FIG. 3A illustrates the basic operation of a control systems diagram, in accordance with embodiments of the present disclosure. As shown in FIG. 3A, in diagram 300, control system 302 can output a signal to column 306, where working distance of the column is adjusted to bring the column focal point range to overlap with sample stage 308. Alternatively, control system 304 can output a signal to sample stage 308, where the sample stage can adjust in height, pitch, tilt, and/or yaw to bring the sample into the working distance range of column 306. In some embodiments, a combination of both adjustments can be made.

According to various embodiments, FIG. 3A is a standard setup. Autofocus sensor 302 measures the height of the wafer on sample stage 308 and stores the height as a distance d. Control system 304 then takes the stored distance and then tracks the stage motion. When the inspection point comes directly underneath microscope column 306, then control system 304 sends out a signal to either column 306 to adjust the dynamic focus in order to bring the focal point to match the stored distance d of the wafer. Alternatively, control system 304 could send a signal to sample stage 308 to move height of the stage up or down in the z direction to bring the wafer into focus. However, moving the stage would typically only be used if all the columns were off or if the distance was very large.

FIG. 3B illustrates an alternate control systems arrangement, in accordance with embodiments of the present disclosure. In some embodiments, as shown in FIG. 3B, diagram 320 does not use auto-focus sensors. Instead, control system 324 uses microscope columns 326 themselves as an array of position sensors. In such embodiments, SEM columns 326 can scan underlying sample 328, even if not actively imaging the sample. In such embodiments, SEM columns 326 can be used for through-focus measurements to determine the point of best focus. By varying the focal point from its nominal position as imaging sample 328 is scanned, the correct focal point can be determined by measuring edge sharpness of the image. In this way, microscope columns 326 themselves can be used as autofocus sensors. In some embodiments, either all or a sub-set of multi-column microscope columns 326 could be used as auto-focus sensors. In this configuration, the actual focal condition of the SEM would be determined even in the event of surface charging because the microscope columns would measure effective focal distance required to achieve proper microscope focus, rather than simply physical distance between the microscope column and substrate.

FIG. 3C illustrates a control systems arrangement using a combination auto-focus strategy, in accordance with embodiments of the present disclosure. In some embodiments, as shown in FIG. 3C, diagram 340 illustrates control system 344 using local auto-focus sensors 342 to get coarse/large corrections for working distance to sample 348, while also controlling column heads 346 to be used for fine/small adjustments of working distance by using through-focus measurements.

In some embodiments, the components required for operation of the auto-focus sensor include an array of microscope columns. In such embodiments, the array of microscope columns could constitute at a minimum a 1×2 (or 2×1) array with no maximum limit to the number of columns arrayed. In some embodiments, the components required for operation of the auto-focus sensor include an array of position or displacement sensors. In such embodiments, the array of sensors could constitute at a minimum a 1×1 array with no maximum limit to the number of sensors arrayed. In some embodiments, the components required for operation of the auto-focus sensor include a sample to be imaged. In such embodiments, the sample could be, but not limited to, a patterned wafer or masked reticle, or any sample or combination of samples to be imaged by the microscope column array. In some embodiments, the components required for operation of the auto-focus sensor include a moving stage to allow for relative motion between the sample and array of microscope columns. In such embodiments, the stage could be a linear motion stage or a rotational stage. Also in such embodiments, the stage could move the sample to be imaged, the array of microscope columns, or a combination of both.

In some embodiments, an array of microscope columns are fixed in position with respect to one another in X, Y, and Z dimensions. In such embodiments, the sample is mounted on a linear translation stage, with motion in X and Y. The stage may have motion in the Z axis, as well as tip, tilt, and/or yaw. In order to bring the sample coarsely into focus underneath a microscope column, the Z-height (as well as tip, tilt, and/or yaw) of the stage is moved to adjust the column-sample physical working distance. In order for each column to finely focus on the sample, the column lenses can be adjusted to adjust the column working distance.

In some embodiments, an inspection tool utilizes a stage that swaths back and forth. The micro column and the stage scans left to right very quickly underneath. In some embodiments, column scans an entire line of the wafer, from left to right. Once column scans the entire line, it increments up a little bit (a predetermined amount) and then scans back the other way. This is how a column raster scans over the entire wafer. In the swathing direction, the stage is usually moving very fast to get good throughput. For example, a single column can typically scan 50 mm/s. In some embodiments, the column scans using a constant velocity. If the stage is moving at constant velocity, the autofocus sensor can be placed upstream in the swathing direction. That way, the time it takes for the stage to travel directly underneath the microscope can be calculated using the velocity. In some embodiments, the control system constantly tracks and records the height of the stage and what is the current working distance.

In some embodiments, rather than moving the stage, control system 304 can send a signal to column 308 to adjust the dynamic focus for the individual column, thereby individually adjusting the working distance on column 308. In some embodiments, instead of adjusting the height of the stage, control system 304 adjusts the tilt and tip of stage 306. In some embodiments, the stage has 6 degrees of freedom: x, y, z, and tip, tilt, and pitch.

In some embodiments, the same effect could be achieved by mounting the microscope columns on stages. The microscope stages could be moved in X, Y, and/or Z. Additionally, the sample stage does not need to be a linear motion stage. It could have one or more rotational or pivotal axes.

In some embodiments, the system is configured to adjust both the working d on the dynamic focus, as well as stage tip tilt simultaneously. As shown in FIG. 3B, control system 324 can use column 326 itself as the sensor (aka "through focus"). With through focus, the column can be adjusted move the dynamic focus up and down from the focal point. The system can then look for the image that has the sharpest focus and store that distance as the working distance. In some embodiments, using a scanning electron microscope involves shooting electron beams to the wafer multiple times. In such embodiments, the wafer has insulating material, e.g., silicon dioxide and dielectrics, which charge up the wafer. The charge subsequently deflects the electron beam and effectively creates a field above the wafer, which affects the practical focal point. Thus, the actual focal point for the column might be slightly above the surface. In other words, the focal point would be different from the actual distance measured using an optical autofocus, which always measures the physical distance to the wafer. Thus, in such cases, it may be advantageous to utilize the column as the sensor.

Figure 4:
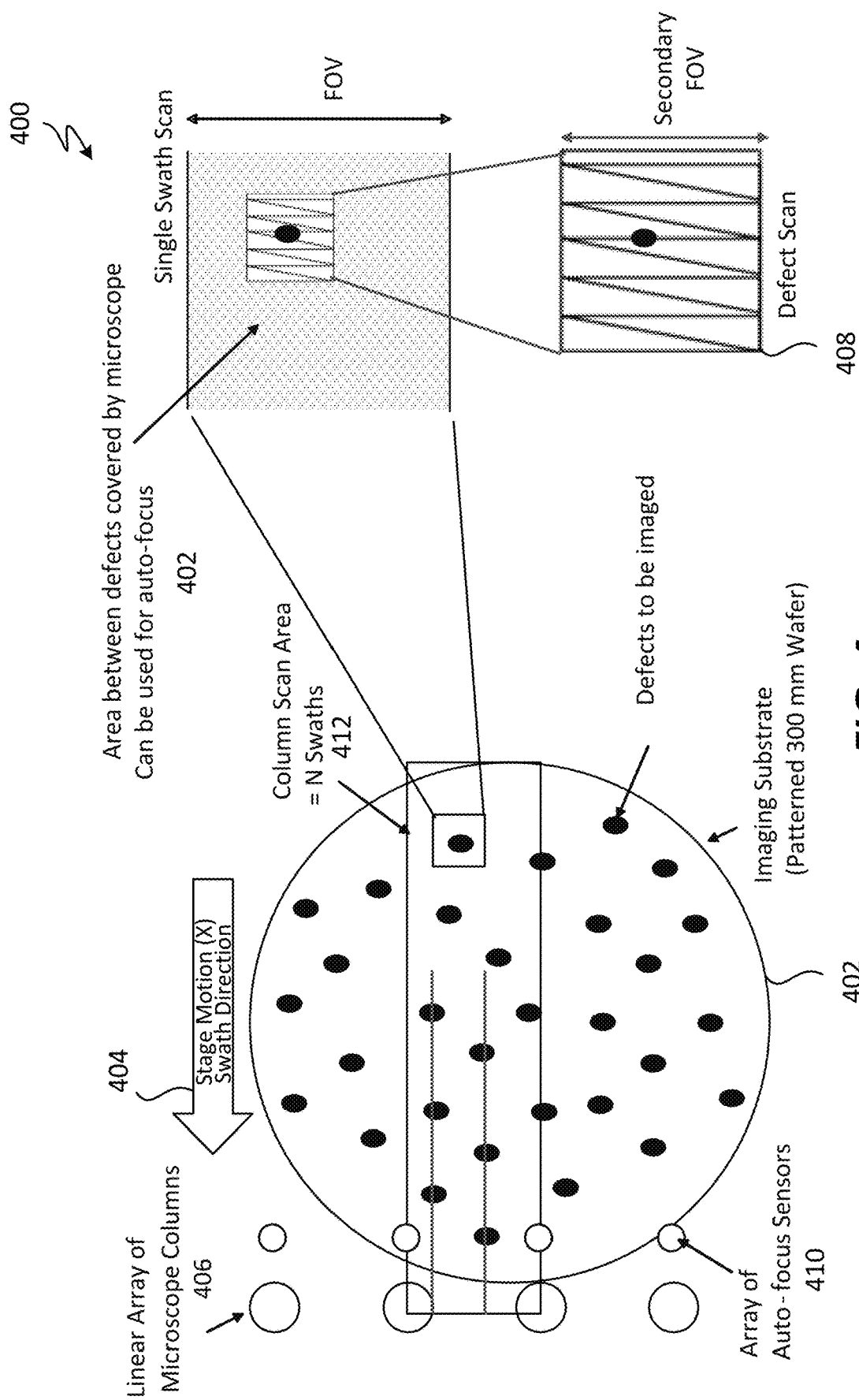
FIG. 4 illustrates an example of multi-column microscope scanning of patterned wafer on swathing stage, in accordance with embodiments of the present disclosure.

FIG. 4 illustrates an example of multi-column microscope scanning of patterned wafer on swathing stage, in accordance with embodiments of the present disclosure. When a column passes over free area between defects, the column can be used as an auto-focus sensor with through-focus measurement. In FIG. 4, example system 400 includes an array of microscope columns 406 directly focusing on a wafer on a stage 402 in a top down view. In FIG. 4, system 400 can scan stage 402 in a stage motion X 404 along the x axis. In FIG. 4, during a scan, wafer 402 is swathing left to right, while autofocus sensors 410 measure the distance to the points on the wafer that will eventually pass under microscope columns 406. In such embodiments, the system then records, via a controller, the distance to these point and as the wafer scans right underneath the points, the controller takes that distance and adjusts the focal distances of the columns to make sure height measurement distances from the autofocus sensors to the wafer, are a based upon the newest autofocus sensor distance measurements. According to various embodiments, the adjustment can be accomplished in a few different ways. One, the controller can cause the stage, if the wafer is mounted on a stage and the stage has z axis control, to move up and down, tip, or tilt, thereby bringing the wafer into the microscope focal point. Two, the controller can also adjust the electron optics or the microscope optics, via a dynamic focus component, to change the focal points of the microscope columns themselves, in order to make the columns focus on the wafer at those particular distances. Last, the system can have the microscope columns on a z axis motor and the controller can send signals to the motor to move the columns up and down.

In some embodiments, the patterned wafer is mounted on a linear motion stage 402 with 6 degrees of freedom (6 DOF). In order to increase speed of imaging, the stage will move in a swathing motion 404 underneath the array of columns 406. Stage 402 will continuously move back and forth on the X axis. As the array of microscopes 406 image the wafer passing underneath, it can generate an imaging line scan 408 in X. Once the line scan is complete, the stage will step and increment in Y, and the stage will resume scanning until the entire area to be imaged underneath the column arrays is complete. For the example of an SEM, the column itself can deflect the beam to generate a raster scan. The beam deflection scan typically has a several hundred um FOV. In example system 400, as stage 402 scans in X, the beam can scan in Y. For each stage swath in X, the beam can cover a strip in Y. A microscope with beam deflection can therefore generate area scans as the wafer stage swaths in the X axis, as shown in FIG. 4.

In some embodiments, the position or distance sensors 410 are placed such that they are in-line with each column 406 of the array in the X-scanning direction. As the wafer is scanned along a line in X, the points to be imaged in column scan area 412 will pass underneath or near both position sensors as well as imaging points of microscope columns 406, as shown in FIG. 4. Sensors 410 will measure the distance to the wafer passing below, and the difference in height can be calculated between the current and previous height measurement.

In some embodiments, a control loop can be used to maintain proper focus for each column in the array. Based on the stage velocity and the physical spacing/distance between the sensor measurement position and microscope column imaging position on the wafer, the time between when the wafer passes under the sensor and when the wafer passes under the microscope imaging position can be determined. As the wafer passes underneath the microscope column, either the microscope working distance can be adjusted or the physical distance between the column and wafer can be adjusted. The former adjustment can be achieved by adjusting column focusing elements to change the focal distance of the microscope column. The latter can be achieved by changing the Z height, tip, tilt, and/or yaw of the wafer stage with respect to the microscope columns (or the z height of a column with respect to the sample, if the column is mounted on a stage).

In some embodiments, for microscopes with focused charged beams, such as scanning electron microscopes, charging of the substrate may cause an offset in the effective focal distance and the physical working distance. In which case, an offset between focal distance and physical working distance can be applied to keep the columns in focus.

Alternatively, in some embodiments, the microscope columns themselves can be used as focal sensors. Either while actively scanning or when not actively scanning (between defects to be imaged), the microscope columns can be imaging. Typical patterned wafers for inspection have on average 100 defects, leaving a large portion of the wafer surface free for use for focusing, as shown in FIG. 4. Columns 402 can be used for focusing, using a through-focus technique, by varying the working distance slightly from its nominal distance and measuring sharpness of edges imaged, the proper working distance can be determined. In some embodiments, one advantage of this method of SEM is that even in the event of substrate charging, both the measured and effective working distances will be the same.

In some embodiments, these adjustments can be performed to maintain all active microscope arrays in the column in focus on the wafer in parallel. According to various embodiments, both local, dedicated auto-focus sensors and columns as through-focus auto-focus sensors can be used in parallel. Dedicated auto-focus sensors can be used for gross working distance adjustments, such as to adjust the height, tip, tilt, and/or yaw of the sample stage. While column through-focus measurements can be used to adjust the working distance of the columns.

In some embodiments, one advantage of the techniques and mechanisms of the present disclosure is that it allows all microscope columns in a multi-column array to simultaneously maintain focus on a sample being imaged below. In some embodiments, another advantage is that it allows all microscope columns in a multi-column array to simultaneously maintain focus on a non-planar sample, such as a patterned wafer with a bowed profile. In some embodiments, another advantage is that it allows all microscope columns in a multi-column array to simultaneously maintain focus on a charged surface where effective focal distance may deviate from physical working distance, especially for electron microscopy.

In some embodiments, the individual microscope columns can be mounted on stages and have the column move with respect to the wafer (rather than the wafer move with respect to the column). Alternatively, both the column and wafer could be on stages and move with respect to each other.

In some embodiments, the stage could either be a linear stage, or could have one or more rotation axes. For example, instead a stage with linear X, Y, Z axes of motion, it could have a linear axis in X and Z axes and a rotation axis in theta Z.

In some embodiments, the sensor array could deviate from a sensor per row in the array of microscope columns. In such embodiments, it could have either fewer or more than one sensor per row of columns. In such embodiments, the main requirement for the number and positioning of sensors is that they are able to get sufficient number of measurements points to map the wafer in X, Y, and Z to allow each active column of the micro-scope array to maintain its focus. If, for example, each individual column has a depth of focus of +/−50 nm and there is only 100 nm of wafer bow from center to edge of the wafer, the sensors could be spaced at a greater distance. In such embodiments, they would only need sufficient spatial resolution to capture change in height of the wafer before it falls outside of the focus on the microscope column.

In some embodiments, auto-focus measurements can be done in series with microscope imaging/scanning. In such embodiments, although this would cause a slower total process time, the auto-focus sensors do not need to be used in parallel with microscope imaging/scanning. In such embodiments, the sensors could first scan and record a height map of the wafer, followed by microscope imaging/scanning. The pre-recorded height map could be used to adjust focus during later imaging/scanning. Furthermore, the auto-focus sensors could be in a separate tool from the multi-column imaging/scanning microscope to record a height maps.

Figure 5:
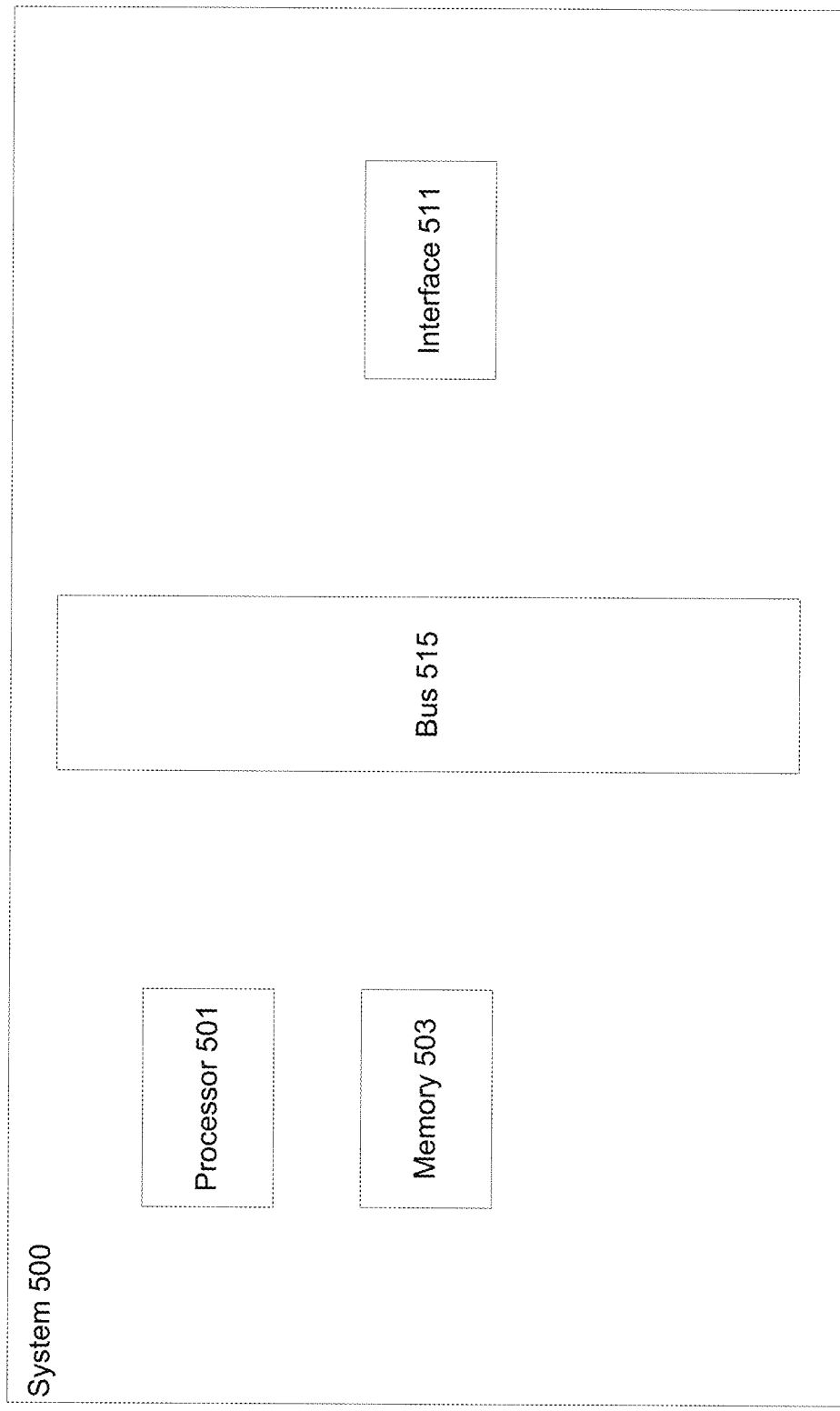
FIG. 5 illustrates an example of a computer system, configured in accordance with one or more embodiments.

The examples described above present various features that utilize a computer system or autofocus sensor system that includes a computer. However, embodiments of the present disclosure can include all of, or various combinations of, each of the features described above. FIG. 5 illustrates one example of a computer system, in accordance with embodiments of the present disclosure. According to particular embodiments, a system 500 suitable for implementing particular embodiments of the present disclosure includes a processor 501, a memory 503, an interface 511, and a bus 515 (e.g., a PCI bus or other interconnection fabric). When acting under the control of appropriate software or firmware, the processor 501 is responsible for implementing applications such as an operating system kernel, a containerized storage driver, and one or more applications. Various specially configured devices can also be used in place of a processor 501 or in addition to processor 501. The interface 511 is typically configured to send and receive data packets or data segments over a network.

Particular examples of interfaces supported include Ethernet interfaces, frame relay interfaces, cable interfaces, DSL interfaces, token ring interfaces, and the like. In addition, various very high-speed interfaces may be provided such as fast Ethernet interfaces, Gigabit Ethernet interfaces, ATM interfaces, HSSI interfaces, POS interfaces, FDDI interfaces and the like. Generally, these interfaces may include ports appropriate for communication with the appropriate media. In some cases, they may also include an independent processor and, in some instances, volatile RAM. The independent processors may control communications-intensive tasks such as packet switching, media control and management.

According to various embodiments, the system 500 is a computer system configured to manage an autofocus sensor system, as shown herein. In some implementations, one or more of the computer components may be virtualized. For example, a physical server may be configured in a localized or cloud environment. The physical server may implement one or more virtual server environments in which the autofocus sensor system is executed. Although a particular computer system is described, it should be recognized that a variety of alternative configurations are possible. For example, the modules may be implemented on another device connected to the computer system.

Certain embodiments of the present disclosure presented here generally address the field of electron beam columns, and are not limited to the hardware, algorithm/software implementations and architectures, and use cases summarized above.

Although the foregoing disclosure has been described in some detail for purposes of clarity of understanding, it will be apparent that certain changes and modifications may be practiced within the scope of the appended claims. It should be noted that there are many alternative ways of implementing the processes, systems, and apparatus of the present disclosure. Accordingly, the present embodiments are to be considered as illustrative and not restrictive, and the disclosure is not to be limited to the details given herein.

What is claimed is:

1. A system comprising:
   a multi-column array of scanning electron microscopes (SEMs);
   an array of autofocus sensors in line with the multi-column array of scanning electron microscopes;
   a controller; and
   a stage configured to hold an imaging sample and to swath in multiple directions.

2. The system of claim 1, wherein the array of auto-focus sensors is configured to allow for simultaneous measurement of working distance or position between multiple microscope columns and imaging substrates.

3. The system of claim 1, wherein the controller is configured to implement a feedback control loop that inputs autofocus sensor signals and outputs signals to adjust either column focal distances or column-to-sample working distances required to allow each active imaging column in multi-column microscope to maintain proper focus on the imaging sample.

4. The system of claim 1, wherein the controller is configured to allow each autofocus sensor in the array of autofocus sensors to independently measure column-to-sample working distances.

5. The system of claim 1, wherein the controller is configured to allow each autofocus sensor in the array of autofocus sensors to measure column-to-sample working distances in parallel with other autofocus sensors.

6. The system of claim 1, wherein the controller is configured to allow each column in the multi-column array of SEMs to independently adjust column-to-sample working distances.

7. The system of claim 1, wherein the controller is configured to allow each column in the multi-column array of SEMs to adjust column-to-sample working distances in parallel with other columns in the multi-column array of SEMs.

8. The system of claim 1, wherein the controller is configured to allow each column in the multi-column array of SEMs to act as an autofocus sensor to measure effective working distances to the imaging sample in between image scans.

9. The system of claim 1, wherein a column of autofocus sensors sits in between two columns of SEMs.

10. The system of claim 1, wherein the controller is configured to move the stage in multiple degrees of freedom.

11. A device comprising:
    a multi-column array of scanning electron microscopes (SEMs);
    an array of autofocus sensors in line with the multi-column array of scanning electron microscopes;
    a controller; and
    a stage configured to hold an imaging sample and to swath in multiple directions.

12. The device of claim 11, wherein the array of autofocus sensors is configured to allow for simultaneous measurement of working distance or position between multiple microscope columns and imaging substrates.

13. The device of claim 11, wherein the controller is configured to implement a feedback control loop that inputs autofocus sensor signals and outputs signals to adjust either column focal distances or column-to-sample working distances required to allow each active imaging column in multi-column microscope to maintain proper focus on the imaging sample.

14. The device of claim 11, wherein the controller is configured to allow each autofocus sensor in the array of autofocus sensors to independently measure column-to-sample working distances.

15. The device of claim 11, wherein the controller is configured to allow each autofocus sensor in the array of autofocus sensors to measure column-to-sample working distances in parallel with other autofocus sensors.

16. The device of claim 11, wherein the controller is configured to allow each column in the multi-column array of SEMs to independently adjust column-to-sample working distances.

17. The device of claim 11, wherein the controller is configured to allow each column in the multi-column array of SEMs to adjust column-to-sample working distances in parallel with other columns in the multi-column array of SEMs.

18. The device of claim 11, wherein the controller is configured to allow each column in the multi-column array of SEMs to act as an autofocus sensor to measure effective working distances to the imaging sample in between image scans.

19. The device of claim 11, wherein a column of autofocus sensors sits in between two columns of SEMs.

20. The device of claim 11, wherein the controller is configured to move the stage in multiple degrees of freedom.

* * * * *